United States Patent
Miyata et al.

(10) Patent No.: US 10,748,988 B2
(45) Date of Patent: Aug. 18, 2020

(54) SEMICONDUCTOR DEVICE (71) Applicant: DENSO CORPORATION, Kariya, Aichi-pref. (JP)

(72) Inventors: Masanori Miyata, Kariya (JP); Shigeki Takahashi, Kariya (JP); Masakiyo Sumitomo, Kariya (JP); Tomofusa Shiga, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/504,858

(22) Filed: Jul. 8, 2019

(65) Prior Publication Data

US 2019/0333987 A1 Oct. 31, 2019

Related U.S. Application Data (63) Continuation of application No. PCT/JP2018/002276, filed on Jan. 25, 2018.

(30) Foreign Application Priority Data

Feb. 3, 2017 (JP) ................... 2017-018672

(51) Int. Cl.
*H01L 29/06* (2006.01)
*H01L 29/08* (2006.01)
*H01L 29/10* (2006.01)
*H01L 29/40* (2006.01)
*H01L 29/739* (2006.01)
(Continued)

(52) U.S. Cl.
CPC ...... *H01L 29/0623* (2013.01); *H01L 27/0823* (2013.01); *H01L 29/06* (2013.01); *H01L 29/0607* (2013.01); *H01L 29/0619* (2013.01); *H01L 29/0821* (2013.01); *H01L 29/0834* (2013.01); *H01L 29/1095* (2013.01); *H01L 29/404* (2013.01); *H01L 29/6634* (2013.01); *H01L 29/66333* (2013.01); *H01L 29/732* (2013.01); *H01L 29/7371* (2013.01);
(Continued)

(58) Field of Classification Search
CPC .......... H01L 29/66333; H01L 29/6634; H01L 29/732; H01L 29/7395; H01L 29/7371; H01L 29/0623; H01L 27/0823; H01L 29/7397; H01L 29/0607; H01L 29/0821; H01L 29/404; H01L 29/1095; H01L 29/08; H01L 29/34; H01L 29/4236
See application file for complete search history.

(56) References Cited

U.S. PATENT DOCUMENTS

6,407,413 B1 6/2002 Kawamoto
2009/0014753 A1 1/2009 Hisamoto et al.
(Continued)

*Primary Examiner* — Joseph C. Nicely
(74) *Attorney, Agent, or Firm* — Posz Law Group, PLC (57) ABSTRACT

A semiconductor device has an element part and an outer peripheral part, and a deep layer is formed in the outer peripheral part more deeply than a base layer. When a position of the deep layer closest to the element part is defined as a boundary position, a distance between the boundary position and a position closest to the outer peripheral part in an emitter region is defined as a first distance, and a distance between the boundary position and a position of an end of a collector layer is defined as a second distance, the first distance and the second distance are adjusted such that a carrier density in the outer peripheral part is lowered based on breakdown voltage in the outer peripheral part lowered by the deep layer.

2 Claims, 6 Drawing Sheets (51) Int. Cl.
   *H01L 29/737* (2006.01)
   *H01L 29/66* (2006.01)
   *H01L 27/082* (2006.01)
   *H01L 29/732* (2006.01)
   *H01L 29/423* (2006.01)

(52) U.S. Cl.
   CPC ...... *H01L 29/7395* (2013.01); *H01L 29/7397* (2013.01); *H01L 29/4236* (2013.01)

(56) References Cited

U.S. PATENT DOCUMENTS

| | | |
|---|---|---|
| 2009/0095977 A1 | 4/2009 | Tsukuda et al. |
| 2013/0087829 A1 | 4/2013 | Tanabe et al. |
| 2014/0197422 A1 | 7/2014 | Wada et al. |
| 2014/0197451 A1 | 7/2014 | Chen et al. |
| 2014/0361334 A1 | 12/2014 | Tanabe et al. |
| 2015/0228717 A1* | 8/2015 | Hara ................ H01L 29/0626 257/140 |
| 2015/0243772 A1 | 8/2015 | Chen et al. |
| 2015/0340443 A1* | 11/2015 | Wada ................ H01L 29/0688 257/77 |
| 2019/0096878 A1* | 3/2019 | Arakawa ............ H01L 27/0727 |

* cited by examiner

SEMICONDUCTOR DEVICE

CROSS REFERENCE TO RELATED APPLICATIONS

The present application is a continuation application of International Patent Application No. PCT/JP2018/002276 filed on Jan. 25, 2018, which designated the U.S. and claims the benefit of priority from Japanese Patent Application No. 2017-18672 filed on Feb. 3, 2017. The entire disclosures of all of the above applications are incorporated herein by reference.

TECHNICAL FIELD

The present disclosure relates to a semiconductor device.

BACKGROUND

Conventionally, there has been a semiconductor device having an element part in which an insulated gate bipolar transistor (IGBT) is formed and an outer peripheral part surrounding the element part.

SUMMARY

The present disclosure provides a semiconductor device having an element part and an outer peripheral part surrounding the element part. In the semiconductor device, a deep layer is formed in the outer peripheral part more deeply than a base layer. When a position of the deep layer closest to the element part is defined as a boundary position, a distance between the boundary position and a position of an emitter region closest to the outer peripheral part is defined as a first distance, and a distance between the boundary position and a position of an end of a collector layer is defined as a second distance, the first distance and the second distance are adjusted such that a carrier density in the outer peripheral part is lowered based on breakdown voltage in the outer peripheral part lowered by the deep layer.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

First, a semiconductor device according to a comparative example will be described. The semiconductor device according to the comparative example includes a semiconductor substrate that has a first surface and a second surface opposite to the first surface and forms a drift layer. In the element part, a base layer of P type is formed on the drift layer, and an emitter region of $N^+$ type is formed on a surface layer of the base layer. Furthermore, a gate electrode is formed to be in contact with the base layer via a gate insulating film. A collector layer is formed on the drift layer on a side opposite to the base layer. Note that the collector layer is formed across the element part and the outer peripheral part. An upper electrode is formed adjacent to the first surface of the semiconductor substrate to be electrically connected to the base layer and the emitter region, and a lower electrode is formed adjacent to the second surface of the semiconductor substrate to be electrically connected to the collector layer.

In the outer peripheral part, a plurality of deep layers of $P^+$ type is formed adjacent to the first surface of the semiconductor substrate to form a multi-ring structure. Note that, the plurality of deep layers is formed deeper than the base layer to restrict electric field concentration in the element part.

In the semiconductor device according to the comparative example, when a predetermined gate voltage is applied to the gate electrode, an inversion layer (that is, channel region) is formed at a portion of the base layer adjacent to the gate electrode. Accordingly, electrons are supplied to the drift layer from the emitter region via the inversion layer, holes are supplied to the drift layer from the collector layer to lower a resistance value of the drift layer due to conductivity modulation, and current flows.

However, in the above-described semiconductor device, since the deep layer deeper than the base layer is formed in the outer peripheral part, a substantive thickness of the drift layer in the outer peripheral part becomes thinner than that in the element part to lower breakdown voltage. Furthermore, in the above-described semiconductor device, the collector layer is formed also in the outer periphery, so that holes are supplied to the drift layer also from the collector layer formed in the outer peripheral part. Accordingly, in the above-described semiconductor device, breakdown easily occurs in the outer peripheral part when current is cutoff in a state where current flows. In the above-described semiconductor device, current is less likely to be swept out in the outer peripheral part than the element part, so that a possibility that the semiconductor device is broken when breakdown is generated in the outer peripheral part becomes high.

A semiconductor device according to an aspect of the present disclosure has an element part and an outer peripheral part surrounding the element part, and includes a semiconductor substrate, a base layer, a gate insulating film, a gate electrode, an emitter region, a deep layer, a collector layer, a first electrode, and a second electrode. The semiconductor substrate has a first surface and a second surface opposite to the first surface and forms a drift layer of a first conductive type. The base layer of a second conductive type is disposed on the drift layer in the element part to be adjacent to the first surface of the semiconductor substrate. The gate insulating film is disposed on each wall surface of a plurality of trenches penetrating the base layer to reach the drift layer and extends along a surface direction of the semiconductor substrate. The gate electrode is disposed on the gate insulating film. The emitter region of the first conductive type is disposed on a surface layer of the base layer, and is in contact with one of the trenches. The deep layer of the second conductive type is disposed on a surface layer of the drift layer in the outer peripheral part to be adjacent the first surface of the semiconductor substrate, and is deeper than the base layer. The collector layer of the second conductive type is disposed adjacent to the second surface of the semiconductor substrate at least in the element part. The first electrode is electrically connected to the emitter region and the base layer. The second electrode is electrically connected to the collector layer. When a predetermined gate voltage is applied to the gate electrode to inject a first carrier in the drift layer from the first electrode via the emitter region and to inject a second carrier in the drift layer from the second electrode via the collector layer, current flows between the first electrode and the second electrode. When, on the first surface of the semiconductor substrate, a position of the deep layer closest to the element part is defined as a boundary position, a distance between the boundary position and a position closest to the outer periphery part in the emitter region into which the first carrier is capable of being injected from the first electrode is defined as a first distance, and a distance between the boundary position and a position of an end of the collector layer in the surface direction of the semiconductor substrate is defined as a second distance, the first distance and the second distance are adjusted such that a carrier density in the outer peripheral part is lowered based on breakdown voltage in the outer peripheral part lowered by the deep layer.

The semiconductor device can restrict generation of breakdown in the outer peripheral part when current is cut off in a state where current flows and can restrict breakdown of the semiconductor device.

Hereinafter, embodiments of the present disclosure will be described on the basis of the accompanying drawings. Note that the same reference numeral is used for the same or equivalent components for description with each other in the following embodiments.

FIRST EMBODIMENT

Figure 1:
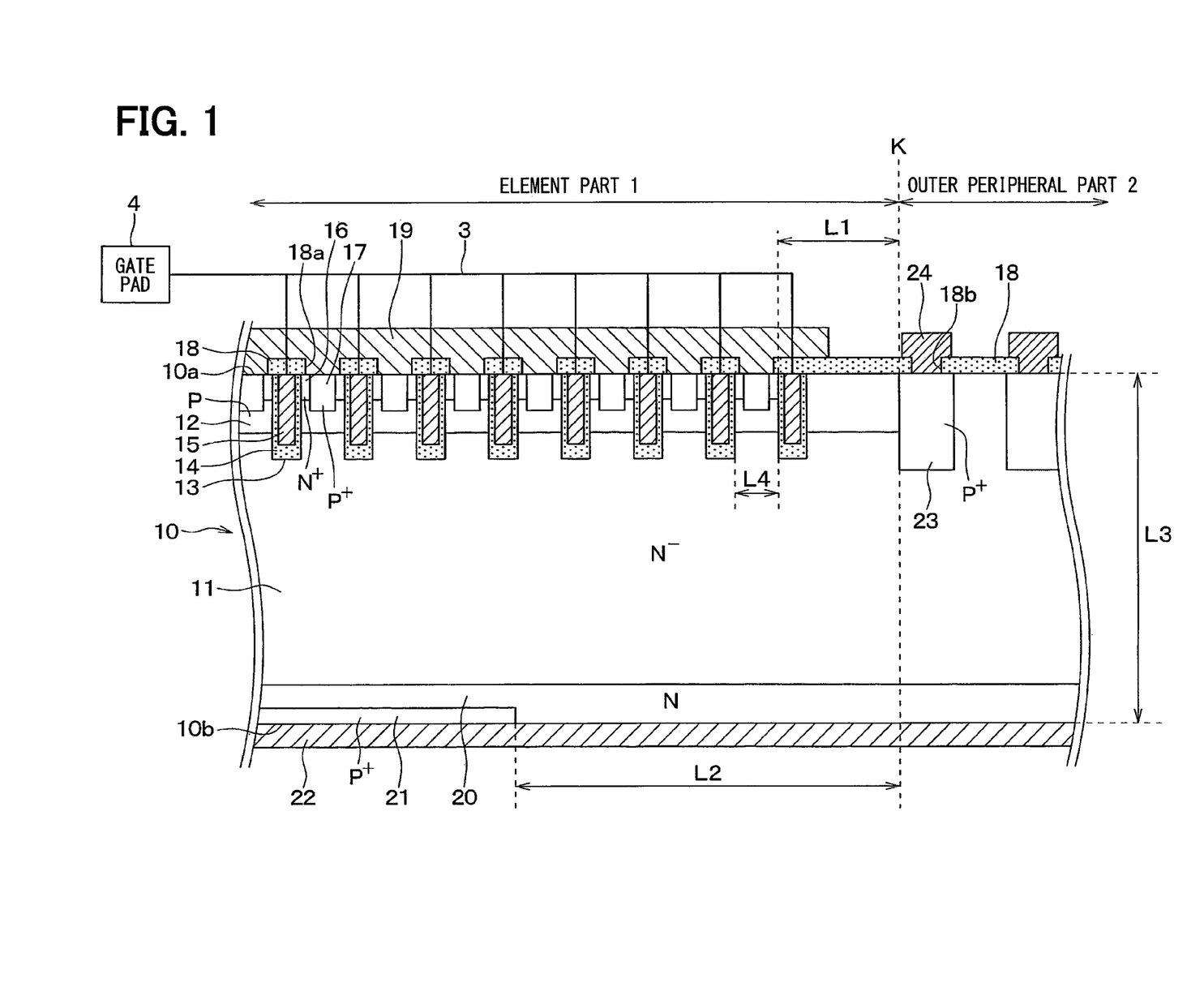
FIG. 1 is a cross-sectional view of a semiconductor device according to a first embodiment.

A semiconductor device according to a first embodiment will be described with reference to FIG. 1. As illustrated in FIG. 1, a semiconductor device according to the present embodiment includes a semiconductor substrate 10 having first surface 10a and a second surface 10b opposite to the first surface 10a. In the semiconductor device, an element part 1 in which an IGBT element is formed and an outer peripheral part 2 surrounding the element part 1 are formed. First, a basic structure of the element part 1 will be described.

The element part 1 incudes a drift layer 11 of N⁻ type, and a base layer 12 of P type is formed on the drift layer 11 to be adjacent to the first surface 10a of the semiconductor substrate 10. Also, a plurality of trenches 13 that penetrates the base layer 12 to reach the drift layer 11 is formed, and the base layer 12 is partitioned by the trenches 13. In the present embodiment, the trenches 13 are formed at regular intervals in a stripe manner along one direction of a surface direction of the first surface 10a of the semiconductor substrate 10 (that is, a direction in a paper depth direction in FIG. 1).

Note that, in the present embodiment, an impurity concentration in the drift layer 11 is set to $1.0\times10^{14}$ cm$^{-3}$. Also, the trenches 13 are formed such that an interval of their side surfaces opposed to each other becomes constant. That is, the interval of adjacent trenches 13 is made constant along from their opening side to their bottom side of the trenches 13.

In the trenches 13, a gate insulating film 14 formed to cover a wall surface of each of the trenches 13, and a gate electrode 15 formed on the gate insulating film 14 are embedded. This forms a trench gate structure. Note that, in the present embodiment, each gate electrode 15 is electrically connected to a gate pad 4 via a gate wiring 3 as appropriate, enabling a predetermined gate voltage to be applied to the gate electrode 15 from an external gate circuit.

An emitter region 16 of N⁺ type and a body region 17 of P⁺ type are formed in a surface layer of the base layer 12. Specifically, the emitter region 16 is formed to have an impurity concentration higher than the impurity concentration of the drift layer 11, and formed to be terminated in the base layer 12 and in contact with a side surface of the trench 13. In contrast, the body region 17 is formed to have an impurity concentration higher than the impurity concentration of the base layer 12, and formed to be terminated in the base layer 12 in a manner similar to the emitter region 16.

To be more specific, the emitter region 16 extends in a bar manner to be in contact with a side surface of the trench 13 along the longitudinal direction of the trench 13 in a region between adjacent two of the trenches 13, and terminated inside a distal end of the trench 13 in its structure. Also, the body region 17 is sandwiched by two emitter regions 16 to extend in a bar manner along the longitudinal direction of the trench 13 (that is, emitter region 16). Note that, the body region 17 according to the present embodiment is formed deeper than the emitter region 16 with respect to the first surface 10a of the semiconductor substrate 10 as a reference.

An interlayer insulating film 18 formed of boro-phospho silicate glass (BPSG) or the like is formed on the first surface 10a of the semiconductor substrate 10. A first contact hole 18a through which a portion of the emitter region 16 and the body region 17 are exposed is formed in the interlayer insulating film 18. An upper electrode 19 electrically connected to the emitter region 16 and the body region 17 via the first contact hole 18a is formed on the interlayer insulating film 18.

A field stop layer of N type (hereinafter, simply referred to as FS layer) 20 is formed on a side opposite to the base layer 12 of the drift layer 11 to be adjacent to the second surface 10b of the semiconductor substrate 10. The FS layer 20 is not always necessary, but is provided in order to improve characteristics of breakdown voltage and steady loss by preventing spread of a depletion layer, and control injection amount of holes injected from a side of the second surface 10b of the semiconductor substrate 10.

A collector layer 21 of P type is formed on a side opposite to the drift layer 11 with the FS layer 20 interposed therebetween, and a lower electrode 22 electrically connected to the collector layer 21 is formed on the collector layer 21 to be adjacent to the second surface 10b of the semiconductor substrate 10.

The basic structure of the element part 1 according to the present embodiment is described above. Next, a basic structure of the outer peripheral part 2 will be described.

The outer peripheral part 2 has a drift layer 11 same as that of the element part 1. A deep layer 23 of P⁺ type deeper than the base layer 12 is formed on a surface layer of the drift layer 11 to restrict electric field concentration in the element part 1. Specifically, since electric field is easily concentrated at a bottom of the trench 13 in the element part 1, the deep layer 23 of P+ type is formed in the outer peripheral part 2 to restrict electric concentration at the bottom of the trench 13. In the present embodiment, a plurality of the deep layers 23 is formed, and is made to have an annular structure each surrounding the element part 1. That is, the plurality of deep layers 23 is formed to form a multiple ring structure.

Note that, although the deep layer 23 is formed deeper than the base layer 12, since a substantive thickness of the drift layer 11 is made thinner as the deep layer 23 is made deeper to lower breakdown voltage, the deep layer 23 is preferably formed to be deeper than the base layer 12 by about 1 µm to 3 µm. Also, in the present embodiment, the deep layer 23 positioned closest to the element part 1 among the plurality of deep layers 23 is formed to be in contact with the base layer 12 formed in the element part 1. That is, the deep layer 23 can be regarded as being formed continuously with the base layer 12.

Also, in the outer peripheral part 2, like in the element part 1, the interlayer insulating film 18 is formed on the first surface 10a of the semiconductor substrate 10, and a second contact hole 18b through which the deep layer 23 is exposed is formed on the interlayer insulating film 18. An outer peripheral electrode 24 electrically connected to the deep layer 23 via the second contact hole 18b is formed on the interlayer insulating film 18.

The FS layer 20 is formed to be adjacent to the second surface 10b of the semiconductor substrate 10 in the outer peripheral part 2. In the outer peripheral part 2, the lower electrode 22 is formed on the FS layer 20 to be adjacent to the second surface 10b of the semiconductor substrate 10.

The basic structure of the semiconductor device according to the present embodiment is described above. Note that, in the present embodiment, N+ type and N− type correspond to a first conductive type, and P type and P+ type correspond to a second conductive type. Also, the upper electrode 19 corresponds to a first electrode, and the lower electrode 22 corresponds to a second electrode.

Next, a basic operation of the above-described semiconductor device will be described. In the above-described semiconductor device, when a predetermined gate voltage is applied to the gate electrode 15 from an external gate circuit in a state where the upper electrode 19 is grounded and a positive voltage is applied to the lower electrode 22, an inversion layer (that is, channel region) is formed in a portion of the base layer 12 in contact with the trench 13. Then, electrons are supplied to the drift layer 11 from the emitter region 16 via the inversion layer, and holes are supplied to the drift layer 11 from the collector layer 21 in the semiconductor device. This lowers a resistance value of the drift layer 11 due to conductivity modulation, and current flows between the upper electrode 19 and the lower electrode 22 in the semiconductor device.

Then, in the above-described semiconductor device, current that flows between the upper electrode 19 and the lower electrode 22 is cut off when a positive voltage is applied to the upper electrode 19, the lower electrode 22 is grounded, and a voltage of, for example, 0 V is applied to the gate electrode 15. Note that, in the following description, a state where current flows between the upper electrode 19 and the lower electrode 22 is defined as on state, and a state where the current is cut off is defined as off state for description. In the present embodiment, an electron corresponds to a first carrier, and a hole corresponds to a second carrier.

Herein, in the present embodiment, at the time when the semiconductor device is made to be in off state from in on state, a positional relation between the emitter region 16 and the collector layer 21 is adjusted to restrict generation of breakdown in the outer peripheral part 2. That is, as described above, when the deep layer 23 deeper than the base layer 12 is formed in the outer peripheral part 2, the substantive thickness of the drift layer 11 in the outer peripheral part 2 becomes thin to make breakdown voltage of the outer peripheral part 2 be readily lowered. Accordingly, in the present embodiment, the positional relation between the emitter region 16 and the collector layer 21 is adjusted such that breakdown is less likely to be generated in the outer peripheral part 2 even when breakdown voltage is lowered. In other words, breakdown voltage in the outer peripheral part 2 is lowered by forming the deep layer 23, so that the positional relation between the emitter region 16 and the collector layer 21 is adjusted to make carrier density in the outer peripheral part 2 be lowered on the basis of lowered breakdown voltage.

Hereinafter, the positional relation between the emitter region 16 and the collector layer 21 will be concretely described. In the following description, as illustrated in FIG. 1, a position of a portion of the deep layer 23 closest to the element part 1 is defined as a boundary position K between the element part 1 and the outer peripheral part 2. Furthermore, a distance between a position closest to the outer peripheral part 2 in the emitter region 16 into which electron (that is, carrier) is capable of being injected from the upper electrode 19 among the plurality of emitter regions 16 (hereinafter, referred to as outermost emitter position) and the boundary position K is defined as a first distance L1. A distance between a position of an end of the collector layer 21 along the surface direction of the semiconductor substrate 10, and the boundary position K is defined as a second distance L2. Note that, the second distance L2 is assumed to be a positive distance in a case where the position of the end of the collector layer 21 along the surface direction of the semiconductor substrate 10 is positioned in the element part 1, and assumed to be a negative distance in a case where the position of the end is positioned in the outer peripheral part 2. Furthermore, a plate thickness of the semiconductor substrate 10 is defined as a third distance L3. A narrowest distance between adjacent trenches 13 is defined as a trench interval L4.

Figure 2A:
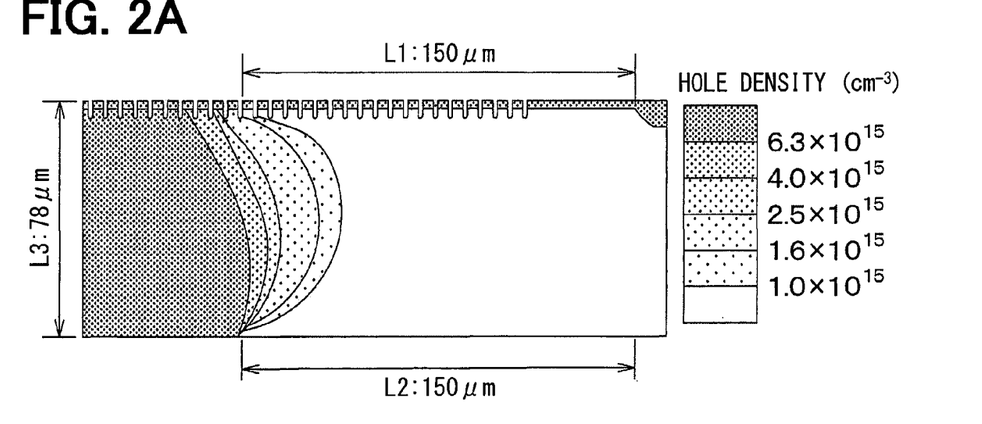
FIG. 2A is a simulation result illustrating hole density in a case where an interval between adjacent trenches is 4 µm.
Figure 2B:
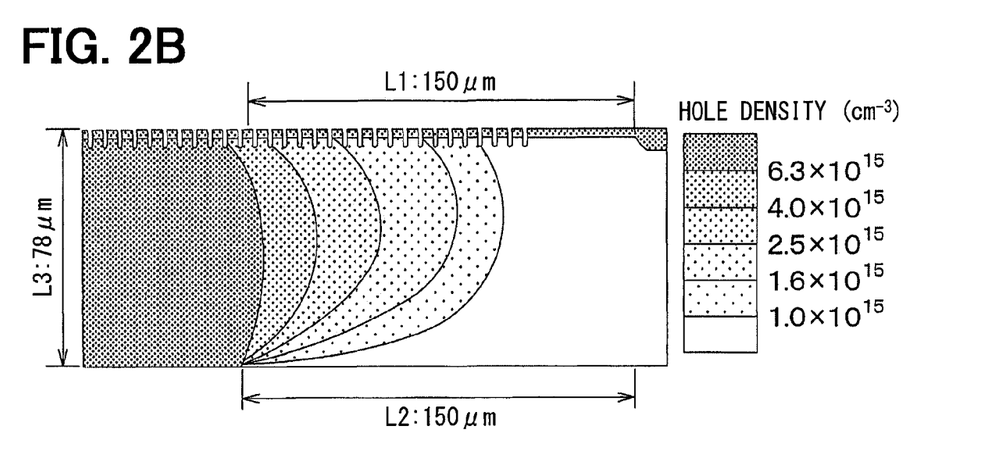
FIG. 2B is a simulation result illustrating hole density in a case where the interval between adjacent trenches is 2 µm.
Figure 2C:
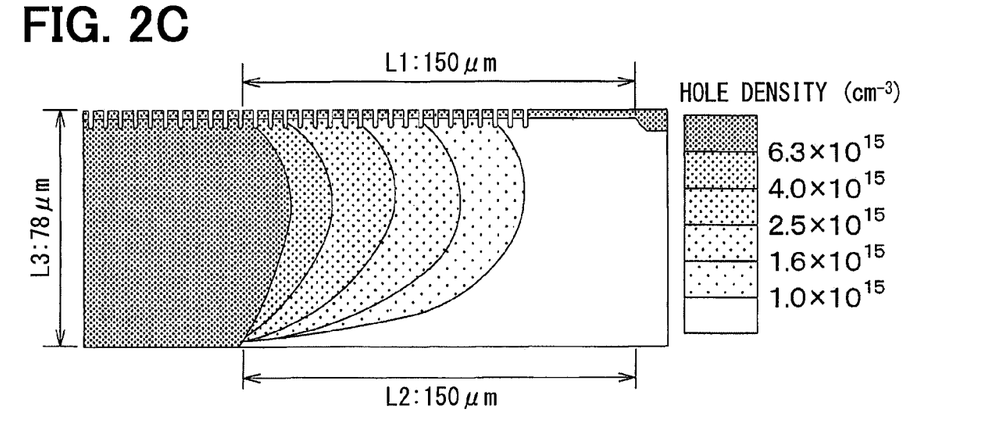
FIG. 2C is a simulation result illustrating hole density in a case where the interval between adjacent trenches is 1.2 µm.

FIG. 2A illustrates a simulation result in a case where the first distance L1 is 150 µm, the second distance L2 is 150 µm, the third distance L3 is 78 µm, and the fourth distance L4 is 4 µm. FIG. 2B illustrates a simulation result in a case where the first distance L1 is 150 µm, the second distance L2 is 150 µm, the third distance L3 is 78 µm, and the fourth distance L4 is 2 µm. FIG. 2C illustrates a simulation result in a case where the first distance L1 is 150 µm, the second distance L2 is 150 µm, the third distance L3 is 78 µm, and the fourth distance L4 is 1.2 µm. First, as described above, when a predetermined gate voltage is applied to the gate electrode 15, electrons are supplied to the drift layer 11 from the emitter region 16, and holes are supplied to the drift layer 11 from the collector layer 21 to make the semiconductor device according to the present embodiment be in on state. In this context, as illustrated in FIG. 2A to FIG. 2C, distributions of hole density are confirmed to be different depending on the trench interval L4. A spread of a portion where hole density is high is confirmed to be larger as the trench interval L4 becomes narrower. That is, among FIG. 2A to FIG. 2C, a portion where hole density is high is spread most in FIG. 2C.

Figure 3:
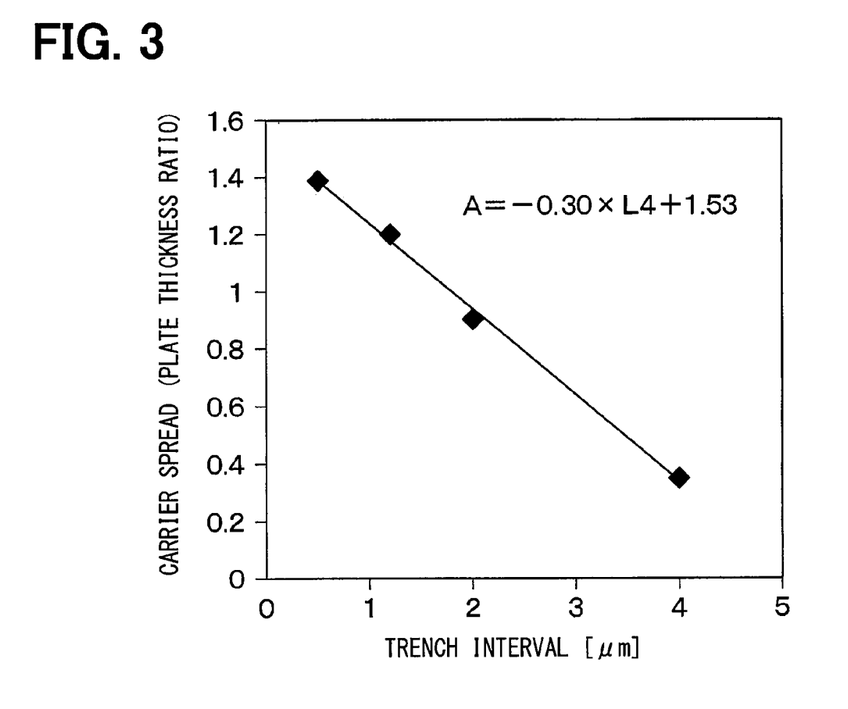
FIG. 3 is a diagram illustrating a relation between the interval between adjacent trenches and a carrier spread on first surface side of the semiconductor substrate.

Accordingly, the inventors of the present invention have studied the spread of carrier on the first surface side with respect to the plate thickness based on the trench interval L4, and obtained a result as illustrated in FIG. 3. That is, as illustrated in FIG. 3, carrier spread A on the first surface side with respect to the plate thickness (hereinafter, simply referred to as carrier spread A) can be expressed by the following formula using the trench interval L4.

$$A = -0.30 \times L4 + 1.53 \tag{Formula 1}$$

Note that the carrier spread A in the present embodiment can be defined as described below. That is, the carrier spread A denotes how far a portion where hole density is ten times of impurity concentration in the drift layer 11 is away from a reference that is a portion just below the outermost emitter position in a portion closest to the first surface 10a of the semiconductor substrate 10 in the drift layer 11. In the present embodiment, the impurity concentration of the drift layer 11 is $1.0 \times 10^{14}$ cm$^{-3}$, so that how far a portion at which the impurity concentration is $1.0 \times 10^{15}$ cm$^{-3}$ is away is illustrated. In other words, how far a boundary between a portion where hole density becomes $1.0 \times 10^{15}$ cm$^{-3}$ or more and a portion where hole density becomes less than $1.0 \times 10^{15}$ cm$^{-3}$ is away from the reference is illustrated. For example, in a case where the carrier spread A is 1, in the portion closest to the first surface 10a of the semiconductor substrate 10 in the drift layer 11, it is meant that the portion at which hole density becomes less than $1.0 \times 10^{15}$ cm$^{-3}$ is away from the portion just below the outermost emitter position by 78 μm (that is, distance corresponding to plate thickness) or more toward the outer peripheral part 2. For example, in a case where the carrier spread A is 0.5, in the portion closest to the first surface 10a of the semiconductor substrate 10 in the drift layer 11, it is meant that the portion at which the hole density becomes less than $1.0 \times 10^{15}$ cm$^{-3}$ is away from the portion just below the outermost emitter position by 39 μm (that is, distance corresponding to half of plate thickness) or more toward the outer peripheral part 2.

Herein, the reason of defining the portion at which a hole density is ten times of the impurity concentration of the drift layer 11 as a boundary is that electric field becomes excessively strong due to positive electric charge of hole when the hole density exceeds ten times of impurity concentration of the drift layer 11, and decrease of breakdown voltage becomes prominent. That is, in the present embodiment, when a portion at which the hole density becomes $1.0 \times 10^{15}$ cm$^{-3}$ or more reaches the outer peripheral part 2, the semiconductor device is easily broken from the portion. Also, the carrier spread A is a ratio with respect to the plate thickness, so that plate thickness×A from the reference becomes a position at which the hole density becomes $1.0 \times 10^{15}$ cm$^{-3}$.

Note that the portion of the drift layer 11 closest to the first surface 10a of the semiconductor substrate 10 becomes a boundary position between the drift layer 11 and the base layer 12 in the element part 1. In the outer peripheral part 2, the portion becomes a boundary position between the drift layer 11 and the deep layer 23. However, in the case of the outer peripheral part 2, in a portion where no deep layer 23 is formed, a position having the same depth as the boundary position at the portion where the deep layer 23 is formed is assumed to be the portion of the drift layer 11 closest to the first surface 10a of the semiconductor substrate 10.

Also, the trench interval L4 is preferably set to at least about 100 nm to prevent inversion layers formed along adjacent trenches 13 from being joined. Furthermore, the trench interval L4 is preferably not more than 8 μm because effect of accumulating holes in the drift layer 11 is significantly lowered when the interval is too wide.

Figure 4:
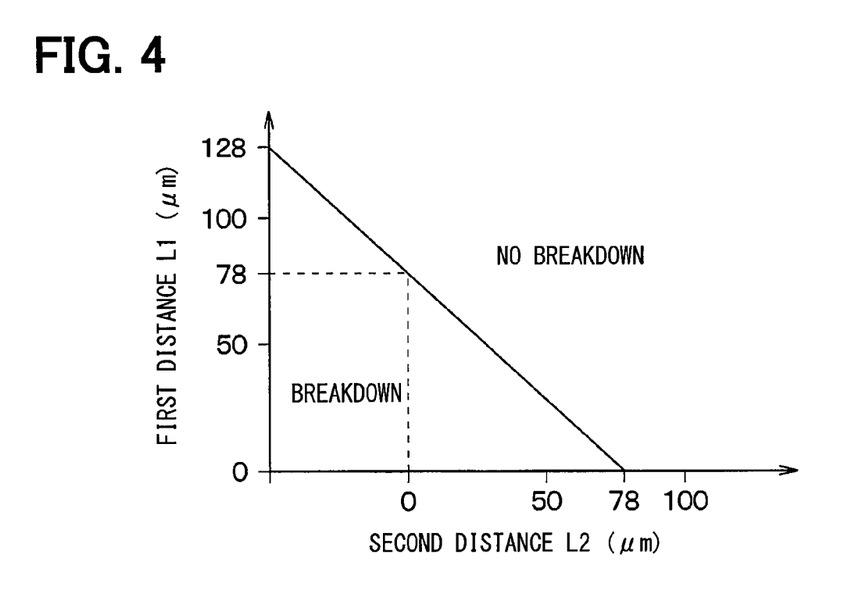
FIG. 4 is a diagram illustrating a relation among a first distance, a second distance, and presence or absence of breakdown of the semiconductor device.

Subsequently, the inventors of the present invention have studied a relation between the first distance L1 and the second distance L2 about whether breakdown is generated in the outer peripheral part 2 to break the semiconductor device at the time when the semiconductor device is made to be in off state from on state, and obtained a result illustrated in FIG. 4. Note that FIG. 4 illustrates a simulation result in a case where the trench interval L4 is 1.8 μm, and the third distance L3 is 78 μm. That is, FIG. 4 is a simulation result in the case where the carrier spread A is 1. In other words, FIG. 4 illustrates a simulation result in a case where a length between the reference and a portion at which the hole density becomes $1.0 \times 10^{15}$ cm$^{-3}$ becomes 78×1.

As illustrated in FIG. 4, in the case where the trench interval L4 is 1.8 μm, the semiconductor device is confirmed to be not broken when the first distance L1 and the second distance L2 satisfy the following formula.

$$L1 \geq 78 \times 1 - L2 \tag{Formula 2}$$

In FIG. 4, the third distance L3 is 78 and the carrier spread A is 1, so that the following formula is obtained when Formula 2 is deformed.

$$L1 \geq L3 \times A - L2 \tag{Formula 3}$$

Accordingly, when above-described Formula 3 is deformed on the basis of Formula 1, the following formula is obtained.

$$L1 \geq L3 \times (-0.30 \times L4 + 1.53) - L2 \tag{Formula 4}$$

Accordingly, in the present embodiment, the first distance L1, the second distance L2, the third distance L3, and the trench interval L4 are set to satisfy the above-described formula.

As described above, in the present embodiment, the first distance L1, the second distance L2, the third distance L3, and the trench interval L4 are set to satisfy $L1 \geq L3 \times (-0.30 \times L4 + 1.53) - L2$. This makes it possible to restrict generation of breakdown in the outer peripheral part 2 at the time when the semiconductor device is switched to be in off state from on state to restrict breakdown of the semiconductor device.

Also, when the relation of $L1 = L3 \times (-0.30 \times L4 + 1.53) - L2$ is satisfied, a carrier density becomes a limit that does not break the semiconductor device. Accordingly, satisfying the relation of $L1 = L3 \times (-0.30 \times L4 + -1.53) - L2$ makes it possible to restrict breakdown of the semiconductor device while lowering on-voltage.

Figure 5:
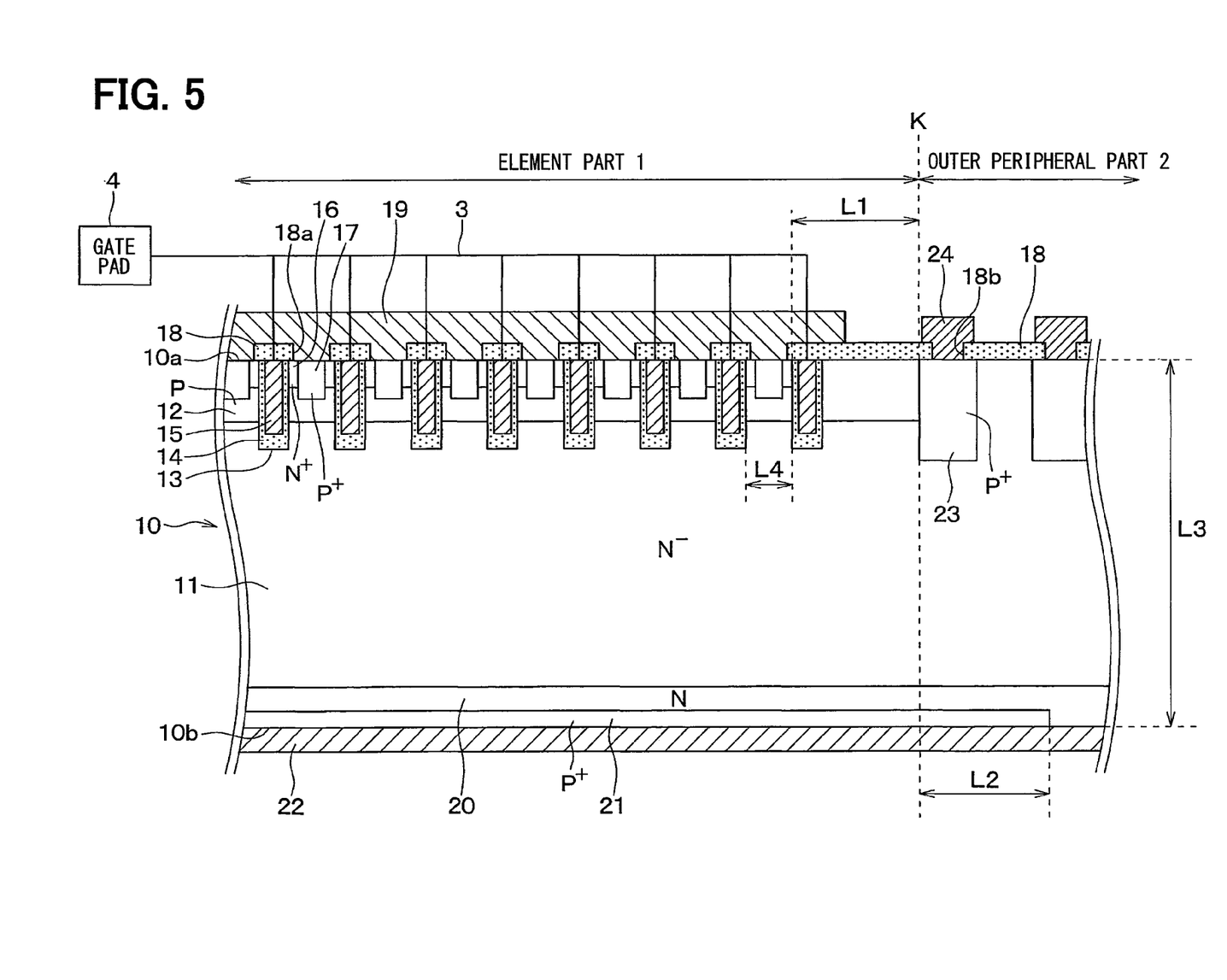
FIG. 5 is a cross-sectional view of another semiconductor device according to the first embodiment.

Note that, in FIG. 1, the end of the collector layer 21 along the surface direction of the semiconductor substrate 10 is positioned in the element part 1. However, the end of the collector layer 21 along the surface direction of the semiconductor substrate 10 may be positioned in the outer peripheral part 2 as illustrated in FIG. 5 as long as above-described Formula 4 is satisfied, and the second distance L2 in this case becomes a negative value.

SECOND EMBODIMENT

A second embodiment will be described. In the present embodiment, some of the plurality of gate electrodes 15 are connected to the gate pad 4, and the remaining of the plurality of gate electrodes 15 are connected to the upper electrode 19 with respect to the first embodiment, and other configurations are same as those in the first embodiment, so that description of the other configurations are omitted.

Figure 6:
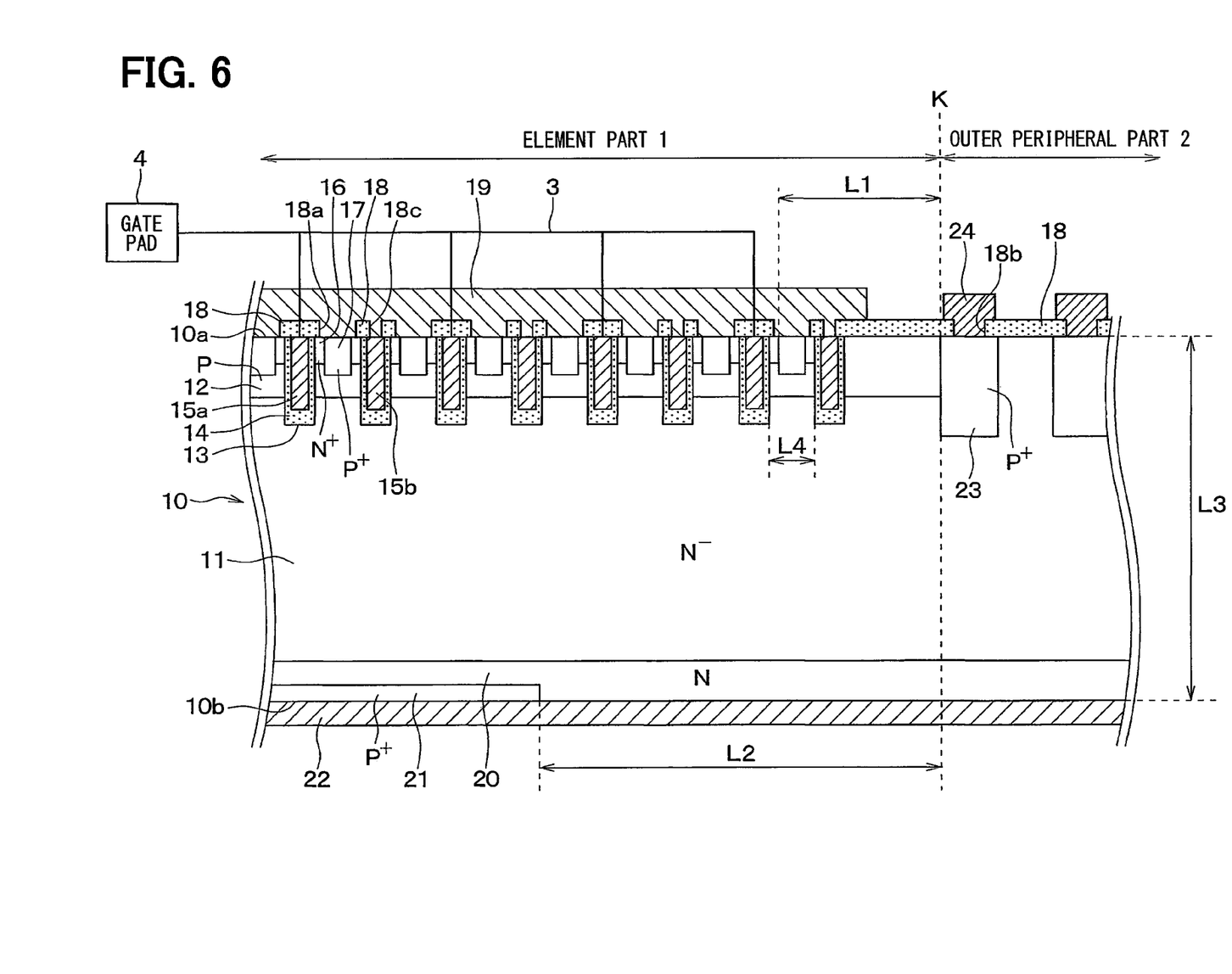
FIG. 6 is a cross-sectional view of a semiconductor device according to a second embodiment.

In the present embodiment, as illustrated in FIG. 6, some of the plurality of electrodes 15, which are gate electrodes 15a, are connected to the gate pad 4. Then, the remaining ones of the plurality of gate electrodes 15, which are gate electrodes 15b, are not connected to the gate pad 4, and are connected to the upper electrode 19 via a third contact hole 18c formed on the interlayer insulating film 18. That is, the gate electrodes 15b connected to the upper electrode 19 are each made to be a so-called dummy electrode that does not exert function of forming an inversion layer on the base layer 12 when the semiconductor device is in on state.

In the present embodiment, supposing that some of the gate electrodes 15 are first gate electrodes 15a, and the remaining ones of the gate electrodes 15 are second gate electrodes 15b, the first gate electrodes 15a and the second gate electrodes 15b are alternately arranged along the surface direction of the semiconductor substrate 10. The first gate electrodes 15a and the second gate electrodes 15b are arranged such that one of the second gate electrodes 15b is positioned closest to the outer peripheral part 2 in the arrangement direction of the first gate electrodes 15a and the second gate electrodes 15b.

Note that, in the present embodiment, the emitter region 16 is formed along each trench 13 like in the above-described first embodiment. That is, in the present embodiment, the emitter region 16 is formed also on the side surface of the trench 13 on which the second gate electrode 15b is disposed.

The first distance L1 is a distance between the outermost emitter position and the boundary position K as described above. Accordingly, in the semiconductor device according to the present embodiment, a distance between the position of the emitter region 16 in contact with the trench 13 where the first gate electrode 15a is disposed and closest to the outer peripheral part 2 and the boundary position K becomes the first distance L1.

As described above, also in the case of the semiconductor device having the second gate electrode (that is, dummy gate electrode) 15b, the same advantageous effect as that in the above-described first embodiment can be obtained by satisfying the above-described Formula 4.

THIRD EMBODIMENT

A third embodiment will be described below. The present embodiment is a modification of the first embodiment in the shape of the trench 13, and other configurations are same as those in the first embodiment, so that description of the other configurations will be omitted.

Figure 7:
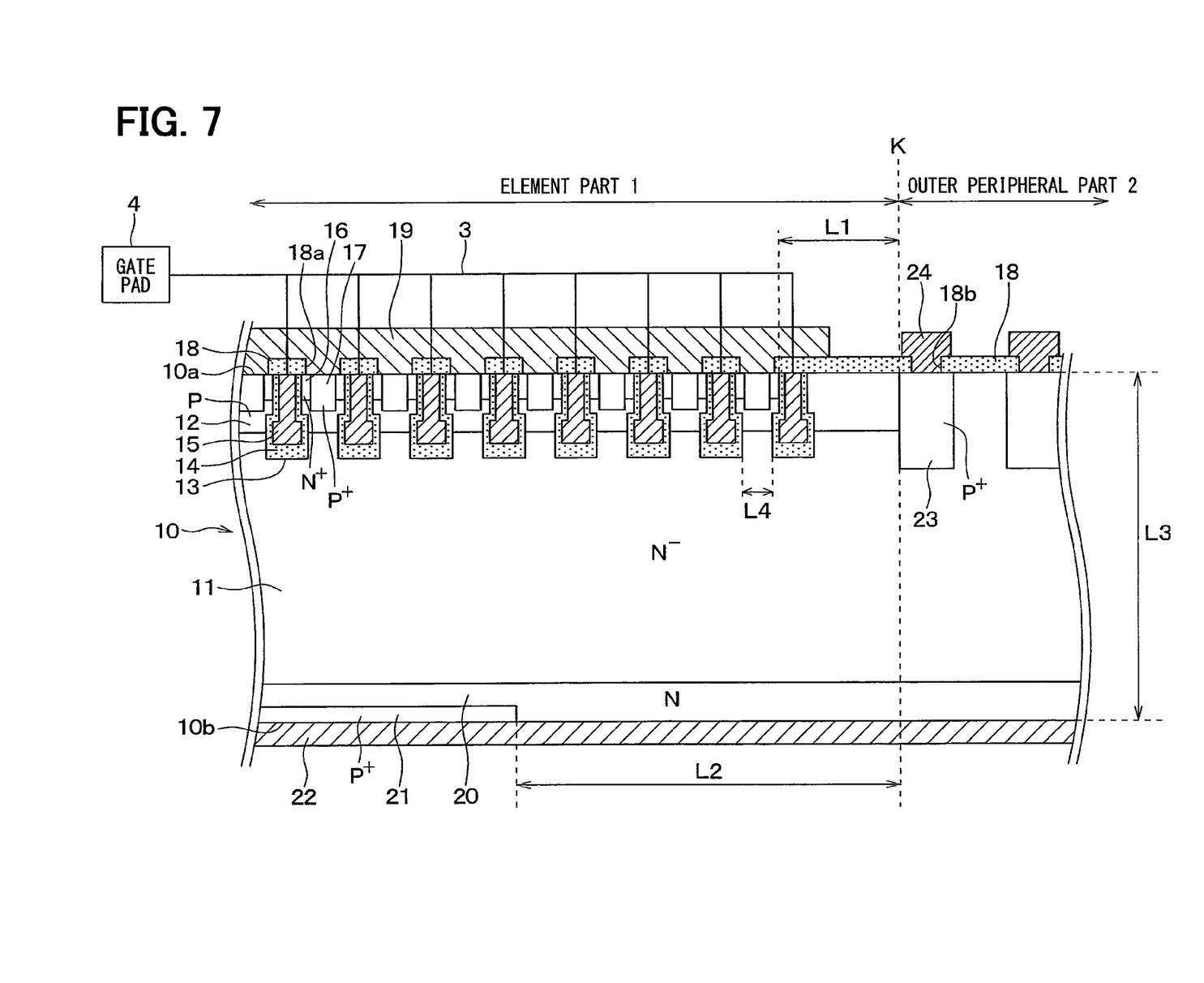
FIG. 7 is a cross-sectional view of a semiconductor device according to a third embodiment.

In the present embodiment, as illustrated in FIG. 7, each trench 13 is made longer in its width on the bottom side than its width on the opening inlet side in interval of their opposing side surfaces. In other words, the interval of adjacent trenches 13 on the bottom side is made shorter than that on the opening inlet side. That is, in the present embodiment, the trench 13 is made to have a so-called pot shape. Note that, the trench interval L4 is of a narrowest portion of the interval of adjacent trenches 13, as described above. Accordingly, in the present embodiment, the trench interval L4 becomes of a portion on the bottom side among portions between adjacent trenches 13.

According to such a semiconductor device, the interval of adjacent trenches 13 on the opening inlet side can be lengthened, making it possible to obtain the same advantageous effect as that in the above-described first embodiment while simplifying the manufacturing process of the emitter region 16 and the body region 17.

OTHER EMBODIMENTS

The present disclosure is described in compliance with the above-described embodiments, but it is understood that the present disclosure is not limited to the embodiments and their configurations. The present disclosure also encompasses various modifications and modifications within the equivalent scope. In addition, various combinations and modes, other combinations or modes including therein only one component, more components, or fewer components are also intended to fall within the scope and idea of the present disclosure.

For example, in each of the above-described embodiments, the example is described in which the first conductive type is N type and the second conductive type is P type, but the first conductive type may be P type and the second conductive type may be N type.

Also, in the above-described second embodiment, the emitter region 16 may not be formed to be in contact with the side surface of the trench 13 on which the second gate electrode 15b is disposed. That is, the emitter region 16 may be formed only on the side surface of the trench 13 on which the first gate electrode 15a is disposed. Also, the second gate electrode 15b may not be connected to the upper electrode 19 and connected to a gate pad different from the gate pad 4 to be kept to have a predetermined electric potential (e.g., ground potential), or may not be connected to an electrode to be in a floating state. Also, the first gate electrodes 15a and the second gate electrodes 15b may be arranged such that one of the first gate electrodes 15a is positioned closest to the outer peripheral part 2 in the arrangement direction of the first gate electrodes 15a and the second gate electrodes 15b.

Also, the above-described second embodiment may be combined into the above-described third embodiment to have the first gate electrodes 15a and the second gate electrodes 15b in the semiconductor device according to the third embodiment.

What is claimed is:

1. A semiconductor device having an element part and an outer peripheral part surrounding the element part, comprising:
    a semiconductor substrate having a first surface and a second surface opposite to the first surface and forming a drift layer of a first conductive type;
    a base layer of a second conductive type disposed on the drift layer in the element part to be adjacent to the first surface of the semiconductor substrate;
    a gate insulating film disposed on each wall surface of a plurality of trenches penetrating the base layer to reach the drift layer and extending along a surface direction of the semiconductor substrate;
    a gate electrode disposed on the gate insulating film;
    an emitter region of the first conductive type disposed on a surface layer of the base layer, the emitter region being in contact with one of the trenches;
    a deep layer of the second conductive type disposed on a surface layer of the drift layer in the outer peripheral part to be adjacent the first surface of the semiconductor substrate, the deep layer being deeper than the base layer;
    a collector layer of the second conductive type disposed adjacent to the second surface of the semiconductor substrate at least in the element part;
    a first electrode electrically connected to the emitter region and the base layer; and
    a second electrode electrically connected to the collector layer, wherein
    when a predetermined gate voltage is applied to the gate electrode to inject a first carrier in the drift layer from the first electrode via the emitter region and to inject a second carrier in the drift layer from the second electrode via the collector layer, current flows between the first electrode and the second electrode, and when, on the first surface of the semiconductor substrate, a position of the deep layer closest to the element part is defined as a boundary position, a distance between the boundary position and a position closest to the outer periphery part in the emitter region into which the first carrier is capable of being injected from the first electrode is defined as a first distance, and a distance between the boundary position and a position of an end of the collector layer in the surface direction of the semiconductor substrate is defined as a second distance, the first distance and the second distance are adjusted such that a carrier density in the outer peripheral part is lowered based on a breakdown voltage in the outer peripheral part lowered by the deep layer and are adjusted based on an interval of adjacent two of the trenches, when a thickness of the semiconductor substrate is defined as a third distance, the second distance is defined as a positive distance in a case where the end of the collector layer is positioned in the element part, the second distance is defined as a negative distance in a case where the end of the collector layer is positioned in the outer peripheral part, the first distance is defined as L1, the second distance is defined as L2, the third distance is defined as L3, and the interval of adjacent two of the trenches is defined as L4, the first distance, the second distance, the third distance, and the interval of adjacent two of the trenches satisfy a relationship of $L1 \geq L3 \times (-0.30 \times L4 + 1.53) - L2$.

2. The semiconductor device according to claim 1, wherein the first distance, the second distance, the third distance, and the interval of adjacent two of the trenches satisfy a relationship of $L1 = L3 \times (-0.30 \times L4 + 1.53) - L2$.

* * * * *